United States Patent [19]

Conzelmann et al.

[11] Patent Number: 5,068,703
[45] Date of Patent: Nov. 26, 1991

[54] ELECTRONIC CIRCUIT DEVICE

[75] Inventors: Gerhard Conzelmann, Leinfelden-Obaraichen; Dietmar Haack, Reutlingen; Gerhard Fiedler, Neckartailfingen, all of Fed. Rep. of Germany

[73] Assignee: Robert Bosch GmbH, Stuttgart, Fed. Rep. of Germany

[21] Appl. No.: 477,881

[22] PCT Filed: Jan. 21, 1989

[86] PCT No.: PCT/DE88/00034
§ 371 Date: Apr. 12, 1990
§ 102(e) Date: Apr. 12, 1990

[87] PCT Pub. No.: WO89/07341
PCT Pub. Date: Aug. 10, 1989

[30] Foreign Application Priority Data

Jan. 30, 1988 [DE] Fed. Rep. of Germany ....... 3802767

[51] Int. Cl.⁵ .................. H01L 29/83; H03F 1/52; H03K 17/08
[52] U.S. Cl. .................................. 357/36; 357/51; 330/298
[58] Field of Search .................. 357/28, 36, 51; 330/298, 307, 309

[56] References Cited

U.S. PATENT DOCUMENTS

| | | | |
|---|---|---|---|
| 3,740,621 | 6/1973 | Carley | 357/36 |
| 4,567,537 | 1/1986 | Kalkhof et al. | 361/18 |
| 4,656,496 | 4/1987 | Widler | 357/36 |
| 4,783,690 | 11/1988 | Walden | 357/36 |

FOREIGN PATENT DOCUMENTS 19355 11/1980 European Pat. Off. .
239960 10/1987 European Pat. Off. .

*Primary Examiner*—William D. Larkins
*Attorney, Agent, or Firm*—Michael J. Striker

[57] ABSTRACT

An electronic circuit device having a monolithic integrated power transistor is disclosed that comprises a parallel connection of a plurality of individual partial transistors (1, 2, 3, ..., n). In order to stabilize the distribution of the sum current to the individual partial transistors (1, 2, 3, ..., n) resistors (41, 42, 43, ... 4n) are provided in their emitter lines. At least one of the resistors (41, 42, 43, ... 4n) in the emitter lines of the partial transistors (1, 2, 3, ..., n) serves as measurement resistor for producing a signal voltage proportional to the current to provide an electronic circuit device having current regulation or current limiting, as shown in FIG. 2.

32 Claims, 5 Drawing Sheets

ELECTRONIC CIRCUIT DEVICE

BACKGROUND OF THE INVENTION

The invention is directed to an electronic circuit device having a monolithic integrated power transistor having a plurality of individual partial transistors connected in parallel.

An electronic circuit device having a monolithic integrated power transistor of this type is disclosed in U.S. Pat. No. 4,656,496. The total required emitter surface of the power transistor is split up into a large number of partial emitters, each having a resistor in the line to the partial emitter. The current distribution in the overall layout of the power transistor can be effectively stabilized by this means when sufficiently large voltage drop is provided at maximum current. An additional measurement resistor and, accordingly, an additional voltage drop would be required for circuit devices having current regulation or current limiting (compare the circuit arrangements according to U.S. Pat. No. 4,567,537), which would mean an increase in the saturation voltage of the power transistor in operation.

SUMMARY OF THE INVENTION

An electronic circuit device in accordance with the present invention comprises a plurality of independent partial transistors connected in parallel. The transistors have resistors in their emitter lines for stabilizing the distribution of the sum current to the individual partial transistors in the power transistor. The device has at least one measurement resistor in an emitter line of one of said partial transistors for providing a signal voltage proportional to the current in said line, thereby providing a device suitable for use in electronic circuits requiring current regulation or current limiting.

In contrast to the previously known devices, the electronic circuit device according to the present invention has the advantage that a measurement resistor for achieving a signal voltage proportional to the current for a regulating circuit in which the monolithic integrated power transistor is incorporated is provided without the saturation voltage of the power transistor being increased. Another advantage is that no additional chip surface is required for the measurement resistor, since the resistors in the emitter lines can be accommodated on the total surface required by the power transistor so as to be neutral with respect to surface, the total surface required by the power transistor being decisively determined by the desired power loss characteristic of the power transistor.

BRIEF DESCRIPTION OF THE DRAWING

The invention is explained in more detail with the aid of the drawing wherein:

FIGS. 5 to 8 show sections from the layout:

FIG. 6 shows the layout section of the circuit, according to FIG. 3, with a Zener diode element as additional component of a cell of the power transistor;

FIG. 7 shows the interconnection of the components mentioned in FIG. 6 forming the bond of the power transistor with the driver stages assigned to the cells, in section; and FIG. 8 shows the formation of a power transistor, according to FIG. 7, with a double-row arrangement of the cells.

DETAILED DESCRIPTION OF THE PREFERRED EMBODIMENTS

Figure 1:
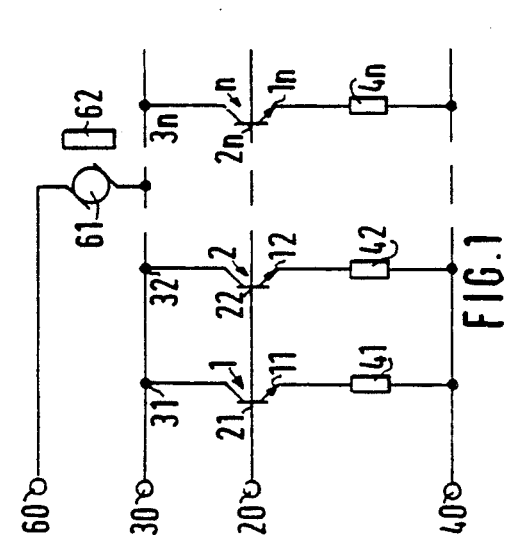
FIG. 1 shows an electronic circuit device, according to the prior art, with an electric motor in the collector circuit of the power transistor. In a known manner, the transistor comprises a plurality of individual transistors connected in parallel and comprising resistors in the emitter lines.

In FIG. 1, the individual transistors formed by means of splitting up the entire emitter surface into a plurality of individual emitters are designated by $1, 2, \ldots, n$: their emitters are $11, 12, \ldots,$; their bases are $21, 22, \ldots, 2n$; and their collectors are $31, 32, \ldots, 3n$; the resistors in the lines to the individual emitters are designated by $41, 42, \ldots, 4n$; the emitter contact, the base contact, and the collector contact of the power transistor formed by means of the parallel connection are 40, 20 and 30, respectively. The armature 61 of a D.C. motor with permanent field 62 lies between the collector contact 30 and the terminal 60 for the positive pole of the operating voltage as an example of a load; the negative pole of the operating voltage is connected to a terminal 40.

Figure 2:
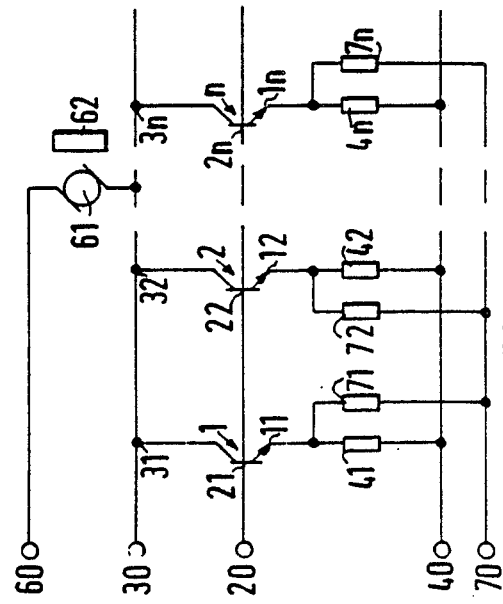
FIG. 2 shows a circuit, according to the invention, in which the resistors in the emitter lines of the individual transistors are utilized, according to the invention, as measurement resistors for achieving a signal voltage proportional to the current, wherein additional resistors are provided for decoupling the signal voltage.

FIG. 2 shows the same configuration as in FIG. 1, but with the addition of resistors $71, 72, \ldots, 7n$ which are connected to the emitter of the partial transistors on one side and to a line 70 for decoupling a signal voltage on the other side. This line can be of metallic construction, particularly using the technology of existing multiple-layer wiring. However, it can also be "buried" by means of low-impedance diffusion zones.

It is particularly advantageous to arrange the resistors $41, 42, \ldots, 4n$ in the layout in direct proximity to the respective emitter, that is, to couple them thermally close to the emitter and give them a positive temperature coefficient. The positive temperature coefficient is not a disadvantage for use of the power transistor as final element of a regulating circuit, since virtually any desired temperature range of the regulating circuit can be exhibited with the use of known means in integrated circuit technology, and the temperature coefficient of the measurement resistors lying in the emitter lines can accordingly also be compensated for. In the present example, they are shown in emitter diffusion; however, they can also be formed by means of a different diffusion or e.g. by means of polysilicon.

It is advantageous for the layout of an integrated power transistor to combine a plurality of partial transistors, according to FIG. 1 or 2, to form cells, wherein the power transistor in turn then consists of the parallel connection of a plurality of cells.

Figure 3:
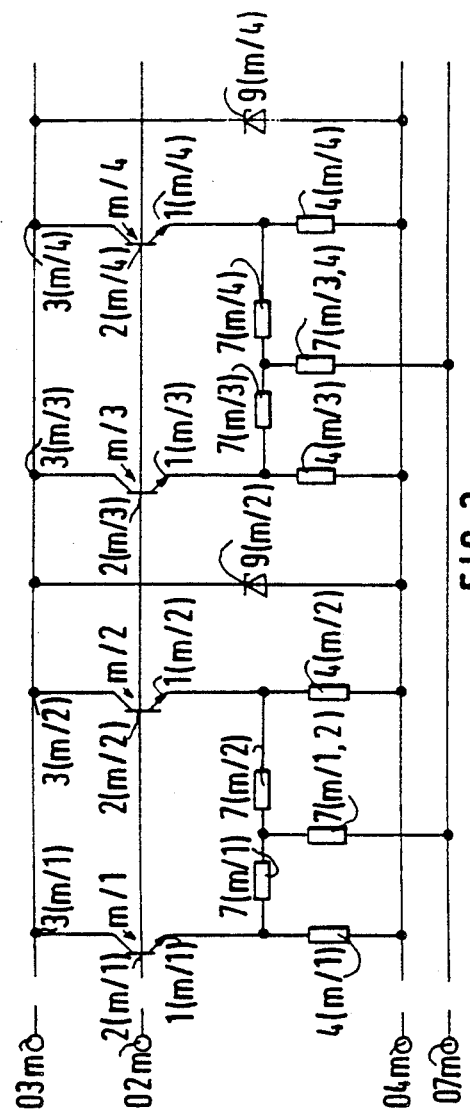
FIG. 3 shows the connections of a section of a layout of a cell of the power transistor.

In FIG. 3, the circuit section of an example shown in layout, the cells are again divided into half cells and components for the mth half cell are entered. The bus or collecting lines for the base, collector and emitter contacts and signal voltage are 02m, 03m, 04m and 07m, respectively; in addition, m/1, m/2, m/3, m/4 are partial transistors combined in pairs with resistors 7 (M/n) which are likewise arranged in pairs. The resistors 7 (m/1) and 7 (m/2) or 7 (m/3) and 7 (m/4), respectively, contact the emitters 1 (m/1) and 1 (m/2), etc., respectively, of the transistors m/1 and m/2, respectively, etc. with one end, while their other ends are connected with one another and are connected to the signal line 07m via a resistor e.g., the resistor 7 (m/1, 2).

Since the width of a cell is determined by the adjacent contact surfaces for emitter and collector on the one hand and by the power loss characteristic desired on the other hand, not only can the resistors 4 (m/1), . . . in the emitter lines and the respective resistors 7 (m/1), . . . for decoupling the signal voltage be accommodated via a buried line 07m, . . . so as to be neutral with respect to surface, but an avalanche or "Zener" diode 9 with high power loss can also be accommodated, whose breakdown voltage is adjusted well below the collector-emitter blocking and saturation voltage of the power transistor, e.g. by means of the implantation dose of the "lower" isolating diffusion. The avalanche diode 9 comprises elements 9 (m/2), 9 (m/4), . . ., which are accommodated in each instance in gaps which are provided between every two pairs of resistors. These avalanche diodes are particularly desirable for use with inductive loads, since they divert the collector current still flowing after turn-off and prevent voltage punch-through.

As will be shown in the following, the layout of a cell is formed from the layout of a half cell by means of mirroring the half cell at that edge of the half cell to which the collector contact collecting line or the collector contact diffusion of the half cell extends.

Figure 4:
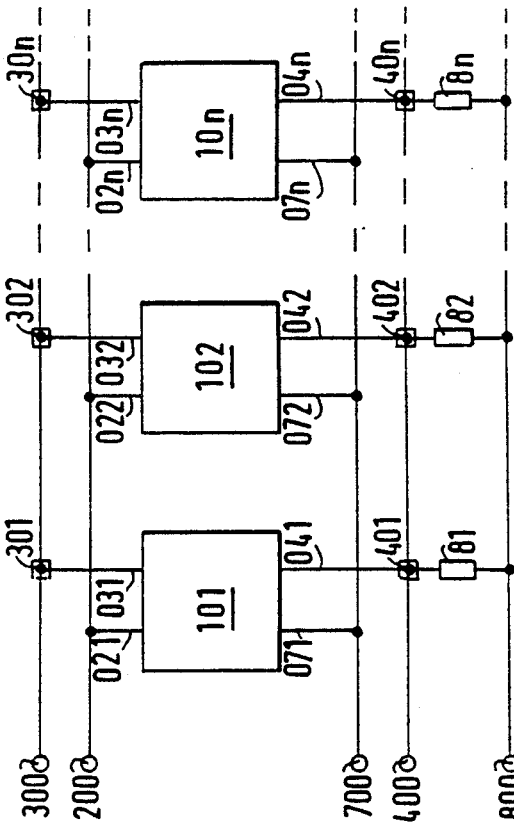
FIG. 4 shows the interconnection of the individual cells to form a layout of the power transistor.

FIG. 4 shows the parallel connection of individual cells 101, 102, . . . , 10n with their electrodes 02n, 03n, 04n and 07n forming the power transistor with analogous connections 200, 300, 400 and 700. A "reference ground" 800 is introduced in addition to these connections.

It can be advantageous for the layout of a monolithic integrated circuit with a high-current power transistor according to the invention, to construct the cells in such a way that the connection pads of the emitter and collector of each cell lie adjacent to one another. Each of these connection pads can then be connected with the outgoing connections 300 and 400 by the shortest distance, e.g. by means of automatically installed whisker wires. However, regardless of whether the emitter contact 041, 042, 04n of every cell is led out directly by means of a whisker wire or is connected to the common emitter 400 in a different layout geometry, troublesome potential differences result between the points 401, 402, 40n with the existing high currents. In order to average out these potential differences, the aforementioned pads are connected, via resistors 81, 82, . . . 8n, with the line 800 which feeds a current-independent ground potential to a regulating amplifier, not shown in the drawing.

Figure 5A:
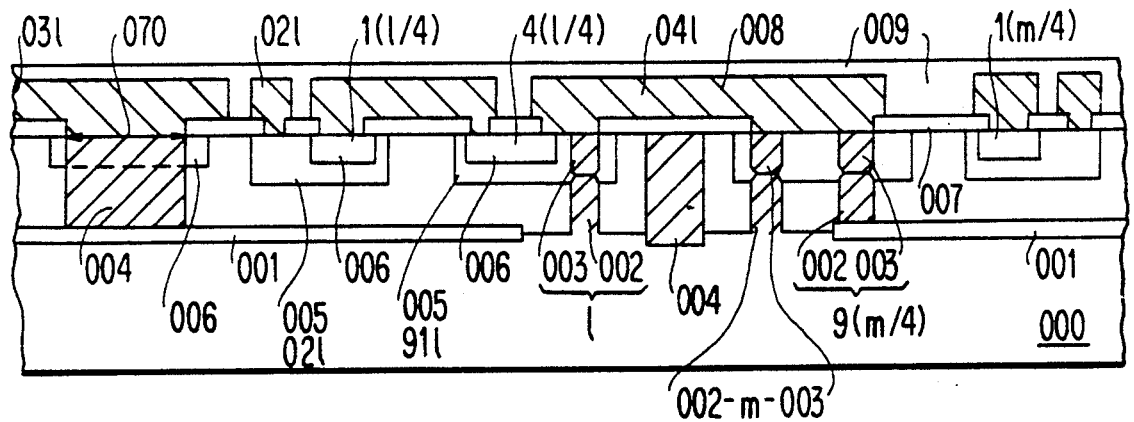
FIG. 5a shows the structure of the circuit device in cross section.
Figure 5B:
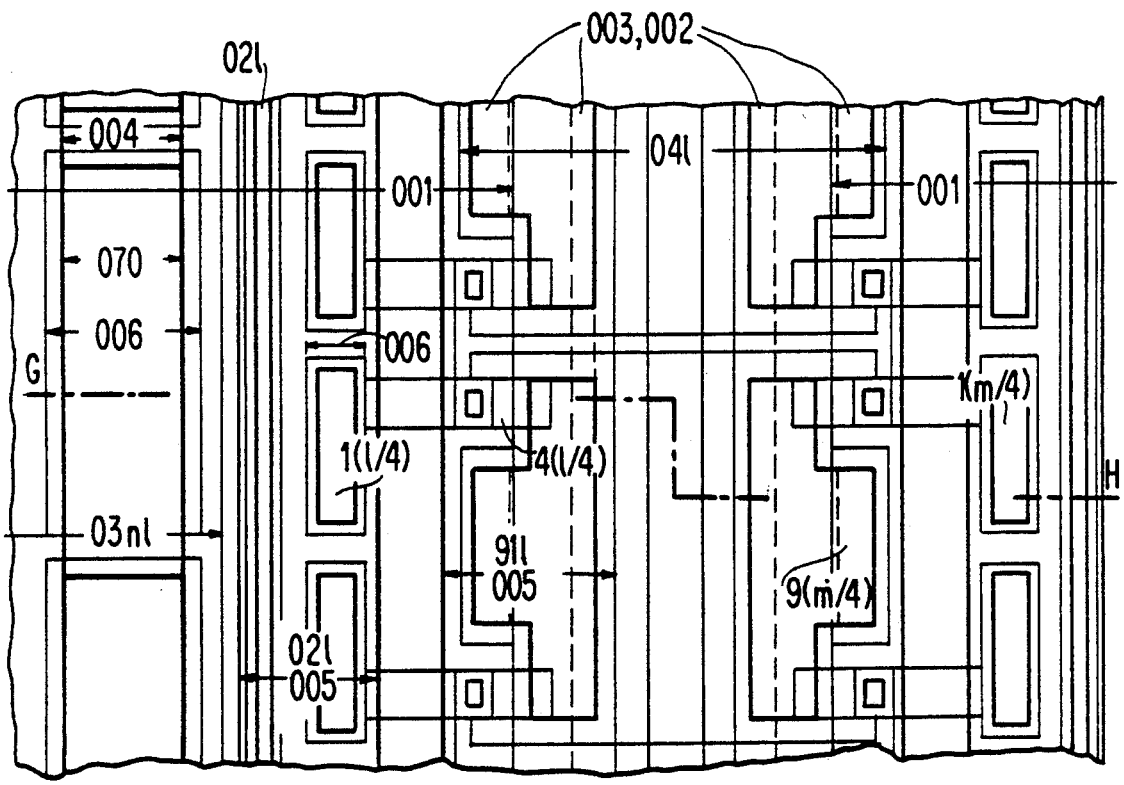
FIG. 5b shows a plan view of the structure of the circuit device.

A possible process for producing a circuit device constructed in accordance with the present invention on monocrystalline silicon is shown by way of example in FIGS. 5a and 5b schematically, i.e. without the staggering due to undercutting and underdiffusion, etc., using the following reference numerals for the layers therein:

| 000 | substrate (p$^-$) |
|---|---|
| 001 | conducting film (n$^+$) |
| 002 | lower isolating diffusion (p$^+$) |
| 100 | epitaxy (n$^-$) |
| 003 | upper isolating diffusion (p$^+$) |
| 004 | collector contact diffusion (n$^+$) |
| 005 | base diffusion (p) |
| 006 | emitter diffusion (n$^+$) |
| 007 | covering oxide |
| 008 | metallization |
| 009 | protective layer |
| 070, 090 | contact window in the planes 007, 009 |

The hatching of the two isolating diffusions 002/003 is a widely-spaced hatching that slants from the bottom left to top right, that of the collector contact diffusion 004 is closely spaced and slants from bottom left to top right, that of the textured metal 008 slants from top left to bottom right. The protective layer 009 can consist of a silane oxide or plasma oxide or plasma nitride.

FIG. 5a shows a section along the line GH of FIG. 5b. In addition, the designations of the components in the section correspond to FIGS. 3 and 4.

FIG. 5b is a plan view of the layout shown in FIG. 5a. The heaviest lines show the outlines of the contact window, the two lightest lines show the outline of the emitter and conducting film. The base is drawn in only slightly lighter than the contact window. When FIG. 5b is viewed together with the section according to FIG. 5a, the corresponding zones can be identified unequivocally.

Figure 6:
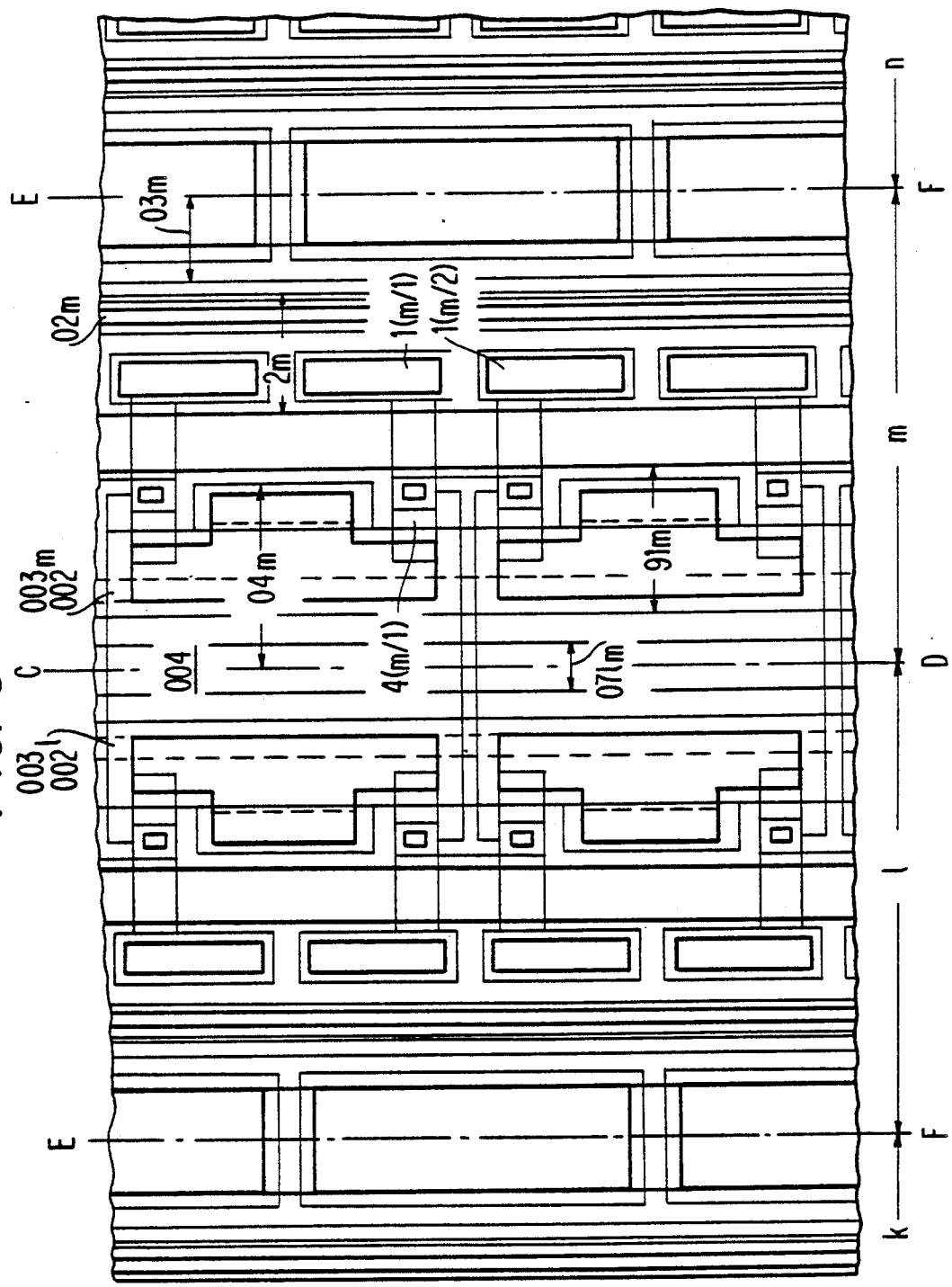

The layout according to FIG. 6 has the topological arrangement of components according to FIGS. 4 and 5. The components discussed above have the same designations again. Since they repeat continuously, they are designated only once within a half cell. The cell is formed from the half cell by means of mirroring at the axis EF of symmetry of the cell. The cell layout is likewise formed from the individual cells by means of arranging individual cells in rows along their boundaries CD or also, because of their symmetry, by means of mirroring at one of the axes CD of symmetry.

The hatching of the metallic lines is slanted from top left to bottom right. In a corresponding manner, the base collecting line of the mth half cell is 02m, the collector collecting line of the mth half cell is 03m, and the emitter collecting line of the mth half cell is 04m. The partial emitters 1 (m/1), 1 (m/2), . . . lie in the reciprocal base region 2m which is connected with 02m.

The resistors 4 (m/1), 4 (m/2), . . . are accommodated in a base region 91m connected to ground by means of the emitter collecting line 04m. The collector zones of the individual cells are isolated from one another by means of the aforementioned "lower" and "upper" isolating diffusion, shown by means of the partial pieces 002l, 003l and 002m, 003m at both sides of the line 07lm which have widely spaced hatching from bottom left to top right, wherein the line 07lm serves to decouple the signal voltage and lies buried under the emitter collecting line 04lm. In this instance, the line 07lm is constructed as part of the heavily n-doped collector contact diffusion layer 004. It may, alternatively, comprise portions of a conductive film material such as layer 001, or portions of the emitter layer 006.

Figure 7:
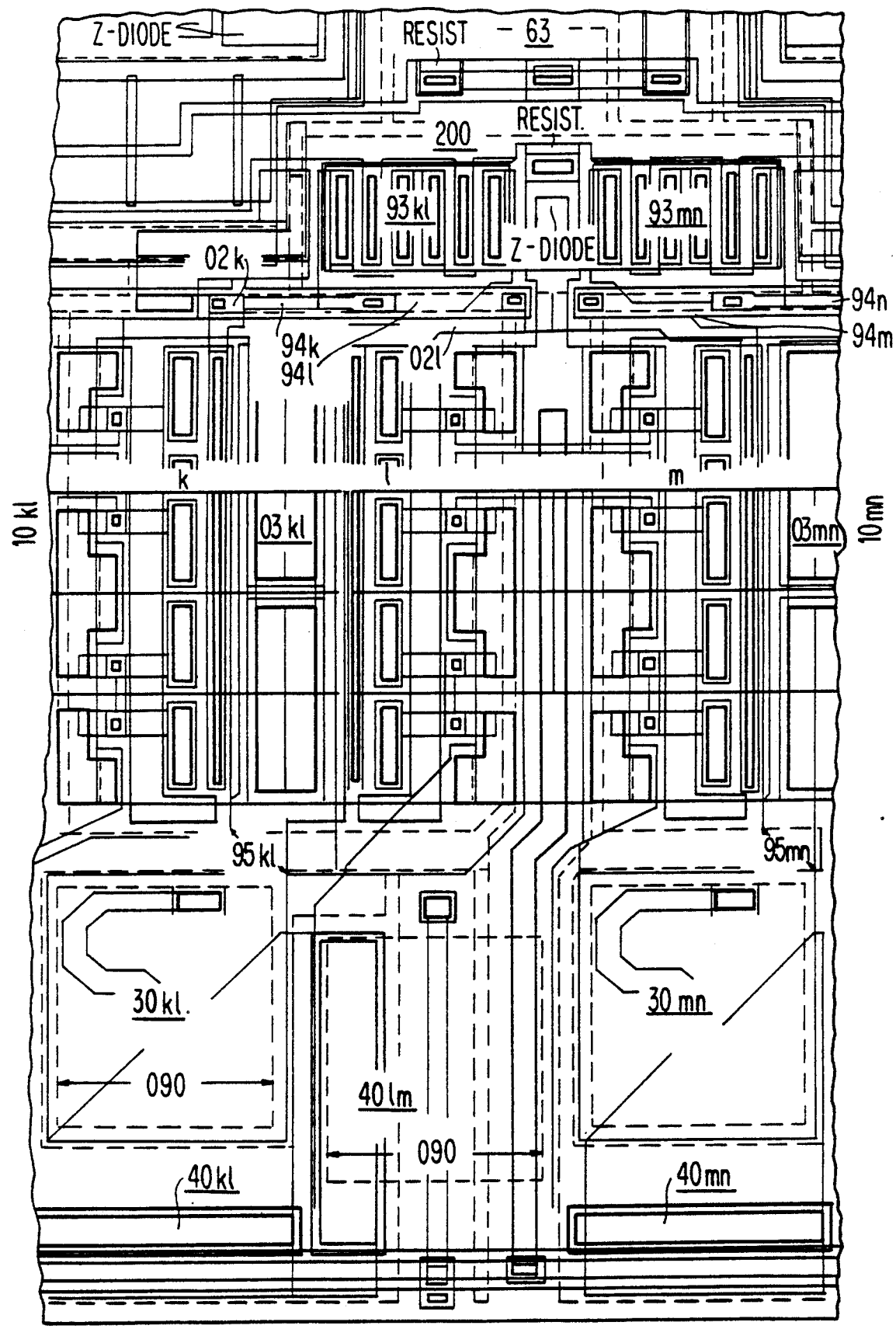

The combination of layers shown in FIG. 6 to form three half cells that are a portion of the power transistor is shown in FIG. 7. The collector connection pads are 30kl, 30mn, . . . and the emitter connection pad is 40lm which is connected with the respective adjacent emitter connection pad via the line segments 40kl and 40mn. In order to keep the base current in the line 200 and also keep its conductor path width sufficiently small, driver stages 93kl, 93mn, . . . , respectively, are assigned to the cells 101, 102, . . . , which driver stages 93kl, 93mn, . . . operate two half cells in each instance and are arranged on the side of the cells remote from these connection pads. The driver stages include additional components such as Zener diodes, resistors, etc.

There are, in addition, resistors 94k and 94l, 94m and 94n, . . . which are connected between the base lines 02k, 02l, 02m and 02n, . . . of the half cells and the emitters of the driving transistors 93kl and 93mn, . . . , as well as the bottlenecks 95kl, 95mn, . . . in the metallization between the connection pads 30kl, 30mn, . . . and the collector lines 03kl, 03mn, . . . of the cells and the line 63 which leads to the positive pole of the operating voltage. Additional components of the monolithic integrated circuit device are easy to arrange above the shown layout section.

Monolithic integrated power transistors which are expensive to manufacture require a high surface power density such as can be achieved e.g. by means of soldering. However, since it is not possible to solder large number of connections absolutely no solder defects and to reliably detect samples with slight solder defects during final testing, a "self-sealing effect" is indispensable for achieving high reliability. This self-sealing effect is achieved by means of the bottlenecks 95kl, 95mn, . . . between the collector connection pad 30kl, 30mn, . . . and the collector collecting line 03kl, 03mn, . . . If a portion of a cell or a plurality of cells is overheated, i.e. passes into intrinsic conductivity, because of a solder defect located below it, the affected part takes over the total possible current and the bottleneck or bottlenecks burn through. Accordingly, the cell in which the destroyed part is located is separated from the rest of the power transistor which remains sound. The resistors 94k, 94l, 94m and 94n, . . . are connected between the base collecting lines 02k, 02l and 02m, 02n, . . . , respectively, of two half cells and the common base collecting line 200 of the cell layout and the transistor row so that the base of the destroyed cell which is directly fused with its emitter does not now take the base current away from the cells which remain sound. The resistors 94k, 94l, 94m and 94n, . . . can be arranged prior to the driving transistors or, as shown here, subsequent to the driving transistors within the zone of the isolating diffusion extending between the power transistor row and the driving transistor row so as to be neutral with respect to surface and can be provided as a part of the emitter diffusion.

Furthermore, it is advantageous for the partial transistors at the core of a cell to operate at a lower current density than those transistors closer to the edge of the cell, so that the surface of the cell is at least approximately equally warm along its entire surface during the operation of the power transistor. In particular, the average current density is preferably varied in this way. This variation in current density can be achieved by varying the emitter surface area, or by varying the resistance in the emitter line.

Figure 8:
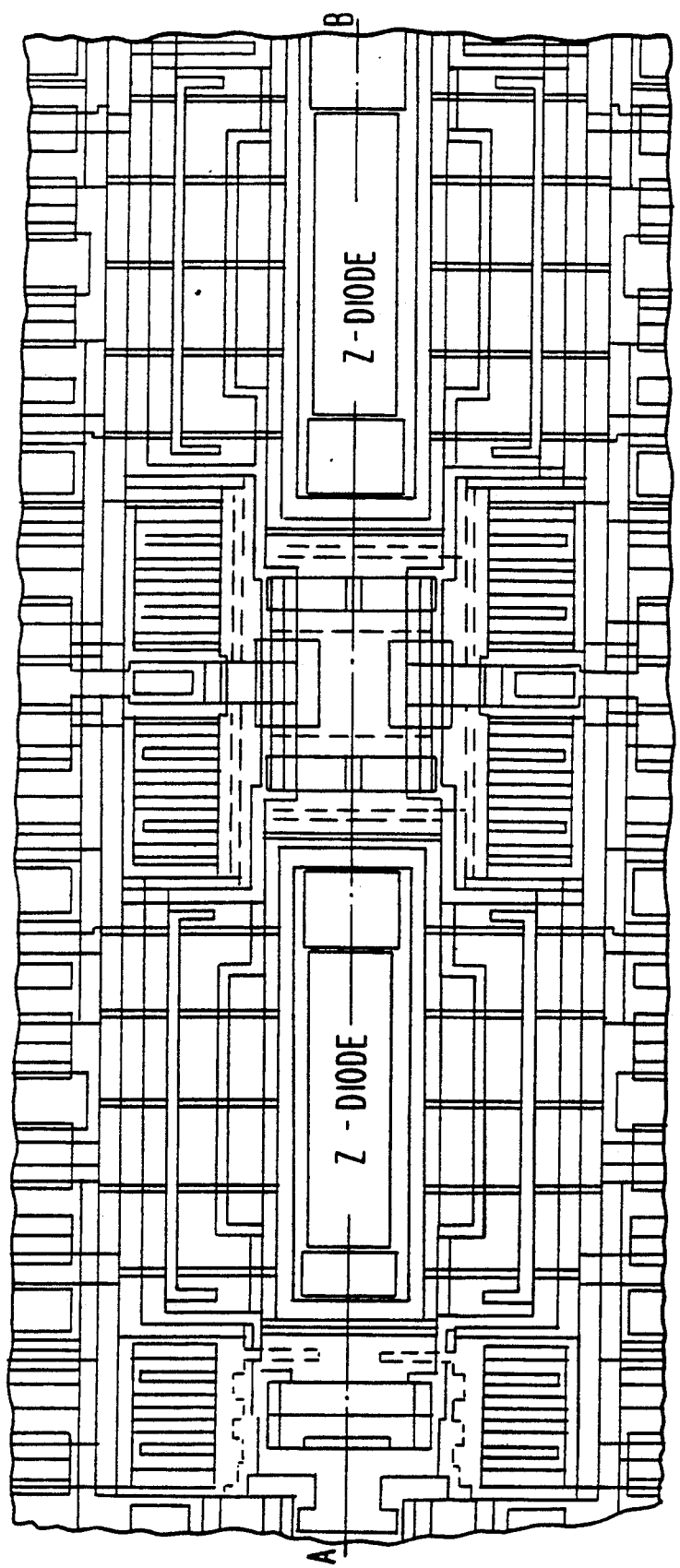

As shown in FIG. 8, it is recommended for monolithic integrated circuits covering a large surface area to mirror the cells, which are combined to form a line, along an axis AB and to arrange additional circuit parts to the left and/or right of the cell layout forming the power transistor.

A half cell of the embodiment example, shown here in section, contains 18 partial emitters and partial transistors, respectively. It remains free from a "second breakdown" at a current of 0.5 A and a load of approximately 7 W. The power transistor was constructed from 56 half cells. Up to 4 cells could separate off due to overload without the characteristic values of the current regulator cooperating with the power transistor being influenced to a significant extent.

The invention has been described with particular reference to the presently preferred embodiments of the invention, however, the invention is defined by the appended claims. It will be apparent to one skilled in the art that variations and modifications of these embodiments are possible without departing from the spirit and scope of this invention.

We claim:

1. An integrated electronic circuit device including a monolithic integrated bipolar power transistor, said device comprising:

a plurality of individual, parallel-connected partial transistors (1, 2, 3, . . . , n), each partial transistor having an emitter, a base, and a collector, having resistors (41, 42, 43, . . . , 4n) connected between their respective emitters and a common emitter line providing the emitter connection for said parallel-connected partial transistors, said resistors stabilizing the distribution of a sum current to the individual parallel-connected partial transistors (1, 2, 3, . . . , n) in the power transistor; and circuit means connected to a node formed by the connection of at least one of said resistors and the corresponding emitter, said circuit means providing a voltage signal proportional to a current flowing through said at least one of said resistors, said voltage signal being provided to means for providing current regulation or current limiting of a power transistor output.

2. The device of claim 1 wherein the individual partial transistors (1, 2, 3, . . . , n) are connected to provide a plurality of cells, each cell forming a portion of the power transistor.

3. The device of claim 2 wherein a plurality a cells form a row, and the collectors of the individual cells (k, l and m, n, respectively) in a row of cells in the power transistor are isolated from one another.

4. The device of claim 3 wherein adjacent emitter and collector connection pads for outgoing emitter and collector connection lines are provided for each cell (k, l and m, n, respectively) in a row of cells in the power transistor.

5. The device of claim 3 wherein the cells (k, l and m, n, respectively) further comprise:

pairs of half cells (k and l, m and n) arranged in a mirror-image, inverted manner relative to one another;

a common collector connection line (03kl and 03mn, respectively) extending along the center of each cell between the half cells in each respective pair of half cells; and emitter connection lines (04k, 04l and 04m, 04n) extending along the two edges of each cell (k,l and m,n, respectively), each of said emitter connection lines (e.g., 04l) of each cell (e.g., k, l) forming a common emitter connection line (e.g., 04lm) with an adjacent emitter line (e.g., 04m) belonging to another cell (e.g., m, n).

6. The device of claim 5 further comprising:
a collector connection pad (30kl, and 30mn) for the collector connection line (03kl and 03mn) of each cell (k, l and m, n, respectively) of the power transistor; and
an emitter connection pad (e.g., 40lm) on each common emitter connection line (e.g., 04lm), said emitter connection pad being located between adjacent collector connection pads (e.g., 30kl, 30mn).

7. The device of claim 4 wherein a first row of cells of two rows of cells in the monolithic integrated power transistor is arranged in a mirror-image, inverted manner relative to the other row of cells, so that the emitter and collector connection pads (e.g., 40lm; 30kl, 30mn) of the respective rows of cells are located along two opposite outer edges of the monolithic integrated power transistor portion of the integrated electronic circuit device.

8. The device of claim 7 wherein a plurality of other circuit elements are arranged between said mirror-image rows of cells in the monolithic integrated bipolar power transistor, said plurality of other circuit elements including driver stage amplifiers, said driver stage amplifiers each including bipolar transistors (93kl, 93mn, . . .) having emitters, bases, and collectors, said driver stage amplifiers further including additional resistors (94k and 94l, 94m and 94n) connected to the bases of their bipolar transistors, said plurality of other circuit elements further including overvoltage protection circuits and power transistor input lines (200; 02k, 02l; 02m, 02n; . . . ).

9. The device of claim 2 wherein the partial transistors in the core of a cell of the power transistor are adapted to operate at a low current density and the partial transistors toward the edge of the cell are adapted to operate with a higher current density, so that said cell is at least approximately equally warm across its entire surface during the operation of the power transistor.

10. The device of claim 9 wherein the partial transistors in the core of a cell of the power transistor are adapted to operate at a low average current density and the partial transistors toward the edge of the cell are adapted to operate at a higher average current density, so that said cell is at least approximately equally warm across its entire surface during the operation of the power transistor.

11. The device of claim 9 wherein each of the emitters (11, 12, 13, . . . , n) of the partial transistors (1, 2, 3, . . . , n) has an emitter surface area and the emitters surface areas of the partial transistors in the core of each of the cells is larger than the emitter surface areas of the partial transistors in the vicinity of the edge of the cell outside of the core of the cell.

12. The device of claim 2 wherein each cell includes at least one of said circuit means, and said circuit means comprises at least one decoupling resistor (71, 72, 73, . . . , 7n) connected between a tap of the emitter side of said emitter resistor and a decoupling line (70) for providing said voltage signal.

13. The device of claim 1 wherein the resistors (41, 42, 43, . . . , 4n) in the emitter lines of the partial transistors (1, 2, 3, . . . , n) of the power transistor have a positive temperature coefficient.

14. The device of claim 1 wherein the resistors (41, 42, 43, . . . , 4n) in the emitter lines of the respective partial transistors (1, 2, 3, . . . , n) of the power transistor are isolated from the bases of the respective partial transistors (1, 2, 3, . . . , n).

15. The device of claim 14 wherein said partial transistors are NPN transistors, the bases of said partial transistors being made of p-doped semiconductor material and wherein said resistors (41, 42, 43, . . . , n) in the emitter lines are formed of respective resistor portions of an emitter diffusion layer, each of said resistor portions of the emitter diffusion layer being formed in a respective isolated portion of a layer of the p-doped base material, each of said respective isolated portions (91k, 91l, 91m, 91n) of the doped material layer being separate from base portions (2k, 2l, 2m, 2n) of said p-doped material layer that provide the bases of the partial transistors (1, 2, 3, . . . , n) in the respective half cells of the power transistor.

16. The device of claim 15 wherein the monolithic integrated power transistor is an n-p-n structure adapted to provide a lower potential to said isolated portions (91k, 91l, 91m, 91n) of the p-doped material layer where the resistors (41, 42, 43, . . . , 4n) in the emitter lines of the respective partial transistors (1, 2, 3, . . . , n) are formed, than to said base portions of the p-doped material layer that provide the bases of the respective partial transistors (1, 2, 3, . . . , n).

17. The device of claim 12 wherein said partial transistors are NPN transistors, the bases of said partial transistors being made of p-doped semiconductor material and wherein said decoupling resistors (71, 72, 73, . . . , n) are isolated from base portions (2k, 2l, 2m, . . . ) of a layer of the p-doped semiconductor material layer that provide the bases of the respective partial transistors (1, 2, 3, . . . , n).

18. The device of claim 17 wherein said decoupling resistors (71, 72, 73, . . . , 7n) comprise portions of an emitter diffusion layer that are formed in respective isolated portions (91k, 91l, 91m, . . . ) of the p-doped material layer that are separate from said base portions (2k, 2l, 2m, . . . ) of said p-doped layer, said decoupling resistors being connected by portions of a collector contact diffusion layer (004).

19. The device of claim 17 wherein said decoupling resistors (71, 72, 73, . . . , 7n) and the resistors (41, 42, 43, . . . , 4n) in the emitter lines of the respective partial transistors (1, 2, 3, . . . , n) of the power transistor are formed in the same isolated portion (91k, 91l, 91m, . . . ) of said p-doped material layer.

20. The device of claim 12 wherein the decoupling line (70) for the voltage signal is an n-doped material layer (004) buried in a monocrystalline semiconductor material in which the monolithic integrated bipolar power transistor is formed.

21. The device of claim 20 wherein said decoupling line (70) comprises a portion of an emitter diffusion layer (006).

22. The device of claim 20 wherein said monolithic integrated power transistor is an epitaxial bipolar device and said decoupling line (70) comprises a portion of a conducting layer (001).

23. The device of claim 20 wherein said monolithic integrated power transistor is an epitaxial bipolar device and said decoupling line comprises a decoupling portion (e.g. 07lm) of a collector connection material layer.

24. The device of claim 2 wherein a p-doped material forms an avalanche diode (9) by contacting an n-doped conducting layer (001) and an outgoing emitter connecting line (e.g., 04*lm*) in each half cell of the power transistor.

25. The device of claim 24 wherein said p-doped material on said conducting layer (001) is an isolating diffusion portion (002, 003) of the monolithic integrated power transistor.

26. The device of claim 24 wherein the avalanche diode (9) comprises individual partial diodes, said diodes being formed in gaps between the resistors ((41, 42, 43, . . . , 4*n*) in the emitter lines of the respective partial transistors (1, 2, 3, . . . , *n*).

27. The device of claim 3 wherein said collector connecting line (03*kl*, 03*mn*) for each cell is connected by a metallization (95*kl*, 95*mn*) to a respective collector connection pad (30*kl*, 30*mn*), each metallization (95*kl*, 95*mn*) having a bottleneck shape such that a defective cell can separate from the collectors of intact cells by causing the metallization to separate at said bottleneck.

28. The device of claim 27 wherein a base dropping resistor (95*k*, 95*l*, 95*m*, 95*n*) is connected in the base input line of each cell so as to decouple the base of a defective cell in the power transistor from intact cells.

29. The device of claim 2 wherein said circuit means comprises a decoupling resistor (71, 72, 73, . . . , 7*n*) connected at one end to said resistor (41, 42, 43, . . . , 4*n*) in the emitter line, and at the other end to a ground reference signal that is independent of the sum current of the power transistor.

30. The device of claim 13 further comprising a regulating circuit which cooperates with the power transistor, said regulating circuit being connected between a control input of said device and a base input of the power transistor, said regulating circuit having a temperature coefficient that at least partially compensates for the temperature coefficients of said respective decoupling resistors and said resistors in the respective emitter lines of the partial transistors.

31. The device of claim 8 wherein said means for providing overvoltage protection includes an avalanche diode.

32. The device of claim 9 wherein the resistors connected to the emitters of partial transistors in the core of each of the cells are larger than the resistors connected to the emitters of partial transistors in the vicinity of the edges of the cells outside of their cores.

* * * * *